US009646820B2

(12) United States Patent
Pore et al.

(10) Patent No.: US 9,646,820 B2
(45) Date of Patent: May 9, 2017

(54) METHODS FOR FORMING CONDUCTIVE TITANIUM OXIDE THIN FILMS

(71) Applicant: ASM INTERNATIONAL N.V., Almere (NL)

(72) Inventors: Viljami Pore, Helsinki (FI); Mikko Ritala, Espoo (FI); Markku Leskela, Espoo (FI)

(73) Assignee: ASM INTERNATIONAL N.V., Almere (NL)

( * ) Notice: Subject to any disclaimer, the term of this patent is extended or adjusted under 35 U.S.C. 154(b) by 115 days.

(21) Appl. No.: 14/570,668

(22) Filed: Dec. 15, 2014

(65) Prior Publication Data
US 2015/0162183 A1 Jun. 11, 2015

Related U.S. Application Data

(63) Continuation of application No. 12/129,609, filed on May 29, 2008, now Pat. No. 8,945,675.

(51) Int. Cl.
*C23C 16/00* (2006.01)
*H01L 21/02* (2006.01)
(Continued)

(52) U.S. Cl.
CPC ........ *H01L 21/0228* (2013.01); *C23C 16/405* (2013.01); *C23C 16/45531* (2013.01);
(Continued)

(58) Field of Classification Search
CPC .................. C23C 16/405; C23C 16/45531
(Continued)

(56) References Cited

U.S. PATENT DOCUMENTS 5,625,217 A 4/1997 Chau et al.
5,783,478 A 7/1998 Chau et al.
(Continued)

FOREIGN PATENT DOCUMENTS

EP 0854 505 A2 7/1998
WO WO94/14198 6/1994
(Continued)

OTHER PUBLICATIONS

Pore et al. Atomic layer deposition of TiO2—xNx thin films for photocatalytic applications, Journal of Photochemistry and Photobiology A: Chemistry 177 (2006) 68-75.*
(Continued)

*Primary Examiner* — Kelly M Gambetta
(74) *Attorney, Agent, or Firm* — Knobbe, Martens, Olson & Bear LLP

(57) ABSTRACT

The present disclosure relates to the deposition of conductive titanium oxide films by atomic layer deposition processes. Amorphous doped titanium oxide films are deposited by ALD processes comprising titanium oxide deposition cycles and dopant oxide deposition cycles and are subsequently annealed to produce a conductive crystalline anatase film. Doped titanium oxide films may also be deposited by first depositing a doped titanium nitride thin film by ALD processes comprising titanium nitride deposition cycles and dopant nitride deposition cycles and subsequently oxidizing the nitride film to form a doped titanium oxide film. The doped titanium oxide films may be used, for example, in capacitor structures.

21 Claims, 10 Drawing Sheets

(51) Int. Cl.
| | |
|---|---|
| *C23C 16/40* | (2006.01) |
| *C23C 16/455* | (2006.01) |
| *H01G 4/12* | (2006.01) |
| *H01G 4/33* | (2006.01) |
| *H01L 49/02* | (2006.01) |

(52) U.S. Cl.
CPC .............. *H01G 4/1218* (2013.01); *H01G 4/33* (2013.01); *H01L 28/60* (2013.01); *H01L 28/75* (2013.01)

(58) Field of Classification Search
USPC ....................................................... 427/248.1
See application file for complete search history.

(56) References Cited

U.S. PATENT DOCUMENTS

| | | | |
|---|---|---|---|
| 6,066,533 A | 5/2000 | Yu | |
| 6,166,417 A | 12/2000 | Bai et al. | |
| 6,225,168 B1 | 5/2001 | Gardner et al. | |
| 6,265,258 B1 | 7/2001 | Liang et al. | |
| 6,291,282 B1 | 9/2001 | Wilk et al. | |
| 6,335,240 B1 | 1/2002 | Kim et al. | |
| 6,368,954 B1 | 4/2002 | Lopatin et al. | |
| 6,373,111 B1 | 4/2002 | Zheng et al. | |
| 6,383,879 B1 | 5/2002 | Kizilyalli et al. | |
| 6,407,435 B1 | 6/2002 | Ma et al. | |
| 6,458,695 B1 | 10/2002 | Lin et al. | |
| 6,482,740 B2 | 11/2002 | Soininen et al. | |
| 6,506,676 B2 | 1/2003 | Park et al. | |
| 6,511,876 B2 | 1/2003 | Buchanan et al. | |
| 6,518,106 B2 | 2/2003 | Ngai et al. | |
| 6,534,395 B2 | 3/2003 | Werkhoven et al. | |
| 6,537,901 B2 | 3/2003 | Cha et al. | |
| 6,579,767 B2 | 6/2003 | Park et al. | |
| 6,596,576 B2 | 7/2003 | Fu et al. | |
| 6,613,695 B2 | 9/2003 | Pomarede et al. | |
| 6,627,503 B2 | 9/2003 | Ma et al. | |
| 6,696,332 B2 | 2/2004 | Visokay et al. | |
| 6,700,771 B2 | 3/2004 | Bhattacharyya | |
| 6,703,708 B2 | 3/2004 | Werkhoven et al. | |
| 6,713,846 B1 | 3/2004 | Senzaki | |
| 6,714,435 B1 | 3/2004 | Dimmler et al. | |
| 6,717,226 B2 | 4/2004 | Hegde et al. | |
| 6,723,581 B1 | 4/2004 | Chabal et al. | |
| 6,730,163 B2 | 5/2004 | Vaartstra | |
| 6,730,588 B1 | 5/2004 | Schinella | |
| 7,575,826 B2* | 8/2009 | Mantese .............. H01M 8/0204 429/479 |
| 2001/0041250 A1 | 11/2001 | Werkhoven et al. | |
| 2002/0008257 A1 | 1/2002 | Barnak et al. | |
| 2002/0030235 A1 | 3/2002 | Agarwal et al. | |
| 2002/0096724 A1 | 7/2002 | Liang et al. | |
| 2003/0049942 A1 | 3/2003 | Haukka et al. | |
| 2003/0072975 A1 | 4/2003 | Shero et al. | |
| 2003/0165615 A1 | 9/2003 | Aaltonen et al. | |
| 2004/0036129 A1 | 2/2004 | Forbes et al. | |
| 2005/0045092 A1 | 3/2005 | Wu et al. | |
| 2005/0073803 A1 | 4/2005 | Cho | |
| 2006/0163655 A1 | 7/2006 | Hoffman et al. | |
| 2006/0205143 A1* | 9/2006 | Govindarajan ..... H01L 27/1087 438/240 |
| 2007/0006798 A1 | 1/2007 | Vaartstra et al. | |
| 2007/0093018 A1 | 4/2007 | Marsh | |

FOREIGN PATENT DOCUMENTS

| | | |
|---|---|---|
| WO | WO 01/29893 A1 | 4/2001 |
| WO | WO 01/66832 A2 | 9/2001 |
| WO | WO 02/43115 A2 | 5/2002 |
| WO | WO 02/50922 A1 | 6/2002 |

OTHER PUBLICATIONS

Diebold, Ulrike. The surface science of Titanium Dioxide, Surf Sci Rep, 48 (2003) pp. 53-229.
1988RD-0296076, "Field Effect Transistor Structure with Improved Transconductance—Contg. Spacer-less Conducting Gate Oxide and Tungsten Deposition on Source and Drain," Anonymous.
Chatterjee et al., "CMOS Metal Replacement Gate Transistors using Tantalum Pentoxide Gate Insulator," IEEE, IEDM, 0-7803-4774-9/98, pp. 777-780 (1998).
Chen et al., "0.18 µm Metal Gate Fully-Depleted SOI MOSFETs for Advanced CMOS Applications," Symposium on VLSI Technology Digest of Technological Papers, pp. 25-26 (1999).
Ducroquet et al., "Full CMP Integration of CVD TiN Damascene Sub-0.1-µm Metal Gate Devices for ULSI Applications," IEEE Transactions on Electron Devices, vol. 48, No. 8, pp. 1816-1821 (2001).
Ferguson et al., "Titanium Nitride Metal Gate Electrode: Effect of Nitrogen Incorporation," Advanced Metallization Conference 2001 (AMC 2001), pp. 115-119.
Furubayashi et al., "Novel transparent conducting oxide: Anatase Ti1-xNbxO2", Thin Solid Films 496 (2006) 157-159.
Gillispie et al. "rf magnetron sputter deposition of transparent conducting Nb-doped $TiO_2$ films on $SrTiP3$" Journal of Applied Physics 101, 033125 (2007).
Hitosugi et al. "Fabrication of highly conductive Ti1-xNbx02 polycrystalline films on glass substrates via crystallization of amorphous phase grown by pulsed laser deposition" Applied Physics Letters 90,212106 (2007).
Hobbs et al., "Sub-Quarter Micron CMOS Process for TiN-Gate MOSFETs with $TiO_2$ Gate Dielectric formed by Titanium Oxidation," Advanced Products Research and Development Lab, Symposium on VLSI Technology Digest of Technical Papers, pp. 133-134 (1999).
Maiti et al., "PVD TiN Metal Gate MOSFETs on Bulk Silicon and Fully Depleted Silicon-On-Insulator (FDSOI) Substrates for Deep Sub-Quarter Micron CMOS Technology," IEEE, IEDM, 0-7803-4774-9/98, pp. 781-784 (1998).
Matero et al., "Effect of water dose on the automatic layer deposition of oxide thin films," Elsevier, *Thin Solid Films* 368 (2000) pp. 1-7.
Park et al., "Robust Ternary Metal Gate Electrodes for Dual Gate CMOS Devices," IEEE, IEDM, 0-7803-7050-3/02, pp. 671-674 (2001).
Polishchuk, "Dual Work Function Metal Gate CMOS Technology Using Metal Interdiffusion," IEEE Electron Device Letter, vol. 22, No. 9, pp. 444-446 (2001).
Suntola, T. "Atomic Layer Epitaxy," *Handbook of Crystal Growth*, vol. 3, Chapter 14, NH 1994, pp. 605-663.
Wakabayashi et al., "A Novel W/TiNx Metal Gate CMOS Technology using Nitrogen—Concentration-Controlling TiNx Film," IEEE, IEDM, 0-7803-5410-9-99, pp. 253-256 (1999).
Yagishita et al., "High Performance Damascene Metal Gate MOSFET's for 0.1 µm Regime," IEEE Transactions on Electron Devices, vol. 47, No. 5, pp. 1028-1034 (2000).
Yagishita et al., Reduction of Threshold Voltage Deviation in Damascene Metal Gate MOSFET's, IEEE, IEDM, 0-7083-5410-9/99, pp. 257-260 (1999).
Yeo et al., "Dual-Metal Gate CMOS Technology with Ultrathin Silicon Nitride Gate Dielectric," IEEE Electronic Device Letters, vol. 22, No. 5, pp. 227-229 (2001).
Zhong et al., "Electrical Properties of $RuO_2$ Gate Electrodes for Dual Metal Gate Si-CMOS," IEEE Electron Device Letters, vol. 21, No. 12, Dec. 2000, pp. 593-595.
U.S. Appl. No. 09/945,463, filed Aug. 31, 2001, titled "Methods for Making a Dielectric Stack in an Integrated Circuit".
Office Action for U.S. Appl. No. 09/945,463, dated Oct. 1, 2003.
Notice of Allowance for U.S. Appl. No. 09/945,463, dated Jun. 9, 2003.
U.S. Appl. No. 10/430,703, filed May 5, 2003, titled "Method of Forming an Electrode with Adjusted Work Function".
Office Action for U.S. Appl. No. 10/430,703, dated Sep. 23, 2005.
Office Action for U.S. Appl. No. 10/430,703, dated Mar. 31, 2005.
Office Action for U.S. Appl. No. 10/430,703, dated Sep. 3, 2004.

(56) References Cited

OTHER PUBLICATIONS

Office Action for U.S. Appl. No. 10/430,703, dated Jul. 22, 2003.
Notice of Allowance for U.S. Appl. No. 10/430,703, dated Dec. 16, 2005.
U.S. Appl. No. 10/430,811, filed May 5, 2003, titled "Method of Depositing Barrier Layer for Metal Gate".
Office Action for U.S. Appl. No. 10/430,811, dated Mar. 18, 2004.
Office Action for U.S. Appl. No. 10/430,811, dated Jun. 27, 2003.
Notice of Allowance for U.S. Appl. No. 10/430,811, dated May 15, 2004.
Leskela et al. Atomic layer deposition (ALD): from precursor to thin film structures, Thin Solid Films 409 (2002) pp. 138-146.
Robertson, J. Band Offsets of High Dielectric Constant Gate Oxides on Silicon, J. Non-Crystalline Solids 303 (2002) pp. 94-100.
Brezeanu, G. et al., High-K Dielectrics in Nano & Microelectronics, Nat'l Seminar of Nanoscience & Nanotechnology, September edition (2010).

\* cited by examiner

METHODS FOR FORMING CONDUCTIVE TITANIUM OXIDE THIN FILMS

CROSS-REFERENCE TO RELATED APPLICATIONS

This application is related to U.S. Pat. No. 6,660,660 to Haukka et al, filed Aug. 31, 2001, entitled Methods for Making a Dielectric Stack in an Integrated Circuit, and U.S. Pat. No. 7,045,406 to Huotari et al, filed May 5, 2003, entitled method of Forming an Electrode with Adjusted Work Function, and U.S. Pat. No. 6,858,524 to Haukka et al, filed May 5, 2003, entitled Method of Depositing Barrier Layer from Metal Gates. The entire disclosure of each of these references is incorporated by reference herein.

Further, any and all applications for which a foreign or domestic priority claim is identified in the Application Data Sheet as filed with the present application are hereby incorporated by reference under 37 CFR 1.57.

PARTIES OF JOINT RESEARCH AGREEMENT

The invention claimed herein was made by, or on behalf of, and/or in connection with a joint research agreement between the University of Helsinki and ASM Microchemistry Oy signed on Nov. 14, 2003. The agreement was in effect on and before the date the claimed invention was made, and the claimed invention was made as a result of activities undertaken within the scope of the agreement.

BACKGROUND OF THE INVENTION

Field of the Invention

The present application relates generally to atomic layer deposition of conductive titanium oxide thin films. The conductive titanium oxide films may serve, for example, as an interface layer between a high k material and a metal electrode.

Background

Transparent conducting oxides are used in a wide variety of applications, including flat panel displays, light emitting diodes and solar cells. Sn-doped $In_2O_3$ (ITO) has been commonly used but suffers from some drawbacks. Recently, it has been found that the conductivity of $TiO_2$ can be increased by doping with niobium or tantalum. These doped anatase thin films have a resistivity value comparable to conventional ITO, making $TiO_2$:Nb and $TiO_2$:Ta candidates for a new transparent conducting oxide.

ALD is a self-limiting process, whereby alternated pulses of reaction precursors saturate a substrate surface and leave no more than one monolayer of material per pulse. The deposition conditions and precursors are selected to ensure self-saturating reactions, such that an adsorbed layer in one pulse leaves a surface termination that is non-reactive with the gas phase reactants of the same pulse. A subsequent pulse of different reactants reacts with the previous termination to enable continued deposition. Thus, each cycle of alternated pulses leaves typically less or no more than about one molecular layer of the desired material. The principles of ALD type processes have been presented by T. Suntola, e.g. in the Handbook of Crystal Growth 3, Thin Films and Epitaxy, Part B: Growth Mechanisms and Dynamics, Chapter 14, Atomic Layer Epitaxy, pp. 601-663, Elsevier Science B.V. 1994, the disclosure of which is incorporated herein by reference. Variations of ALD have been proposed that allow for modulation of the growth rate. However, to provide for high conformality and thickness uniformity, these reactions are still more or less self-saturating.

Atomic layer deposition of conducting oxides has focused mainly on $SnO_2$, ITO and ZnO. These materials contain elements that are uncommon in integrated circuits (ICs) and zinc in particular is not used in the IC context. ALD of mixed titanium oxide films has thus far been concerned with improving the insulating properties of the films, not with preparing conductive films.

SUMMARY

A need therefore exists for controllable and reliable methods for forming conductive titanium oxide thin films. In accordance with one aspect of the present invention, methods for forming doped titanium oxide thin films on a substrate in a reaction chamber by atomic layer deposition (ALD) are provided. In some embodiments, the methods include a titanium oxide deposition cycle comprising: providing a vapor phase reactant pulse comprising a titanium precursor into the reaction chamber to form no more than about a single molecular layer of the titanium precursor on the substrate, removing excess reactant from the reaction chamber, providing a vapor phase reactant pulse comprising an oxygen precursor to the reaction chamber such that the oxygen precursor reacts with the titanium precursor on the substrate, and removing excess second reactant and any reaction byproducts from the reaction chamber. The methods also include dopant oxide deposition cycles comprising: providing a vapor phase reactant pulse comprising a niobium or tantalum precursor to the reaction chamber, removing excess reactant from the reaction chamber, providing a vapor phase reactant pulse comprising an oxygen precursor to the reaction chamber such that the oxygen precursor reacts with the niobium or tantalum precursor on the substrate, and removing excess reactant and any reaction byproducts from the reaction chamber. The titanium oxide and dopant oxide deposition cycles are repeated until a thin film of a desired thickness and composition is obtained. In some embodiments the doped titanium oxide layer is subsequently annealed to form a conductive titanium oxide thin film.

In accordance with another aspect of the present invention, methods for forming memory capacitors in integrated circuits are provided. The methods typically comprise: depositing a bottom electrode, depositing a conductive titanium oxide layer doped with a group V (for example V, Nb, Ta) metal by ALD on the bottom electrode, depositing an ultra-high-k layer directly over and contacting the titanium oxide layer, and depositing a top electrode directly over and contacting the ultra-high-k layer.

In accordance with another aspect of the present invention, methods for forming doped titanium oxide thin films on a substrate in a reaction chamber by atomic layer deposition (ALD) are provided. In some embodiments, the methods include titanium nitride deposition cycles and dopant nitride deposition cycles that are repeated in a ratio that produces a doped oxide film with the desired composition and thickness.

The titanium nitride deposition cycle may comprise: providing a vapor phase first reactant pulse comprising a titanium precursor into the reaction chamber to form no more than about a single molecular layer of the titanium precursor on the substrate, removing excess first reactant from the reaction chamber, providing a vapor phase second reactant pulse comprising a nitrogen precursor to the reaction chamber such that the nitrogen precursor reacts with the titanium precursor on the substrate, and removing excess second reactant and any reaction byproducts from the reaction chamber. The dopant nitride deposition cycles may comprise: providing a vapor phase first reactant pulse comprising a dopant precursor, such as a niobium or tantalum precursor to the reaction chamber, removing excess first reactant from the reaction chamber, providing a vapor phase second reactant pulse comprising a nitrogen precursor to the reaction chamber such that the nitrogen precursor reacts with the niobium or tantalum precursor on the substrate, and removing excess second reactant and any reaction byproducts from the reaction chamber. The titanium nitrogen and dopant nitride deposition cycles are repeated at a ratio that produces a thin film of a desired thickness and composition. In some embodiments, the doped titanium nitride thin film is oxidized to form a doped titanium oxide thin film The doped titanium oxide layer may be subsequently annealed to form a conductive titanium oxide thin film.

In accordance with another aspect of the present invention, methods for forming memory capacitors in integrated circuits are provided. In some embodiments, the methods typically comprise: depositing $Ti_{1-x}Nb_xN_y$ or $Ti_{1-x}Ta_xN_y$; forming a bottom electrode or interfacial layer by converting at least a portion of the $Ti_{1-x}Nb_xN_y$ or $Ti_{1-x}Ta_xN_y$ to a conductive layer comprising $Ti_{1-x}Nb_xO_y$ or $Ti_{1-x}Ta_xO_y$; depositing an ultra-high-k layer; and depositing a top electrode directly over and contacting the ultra-high-k layer.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

All of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiment(s) disclosed.

DETAILED DESCRIPTION

Figure 1:
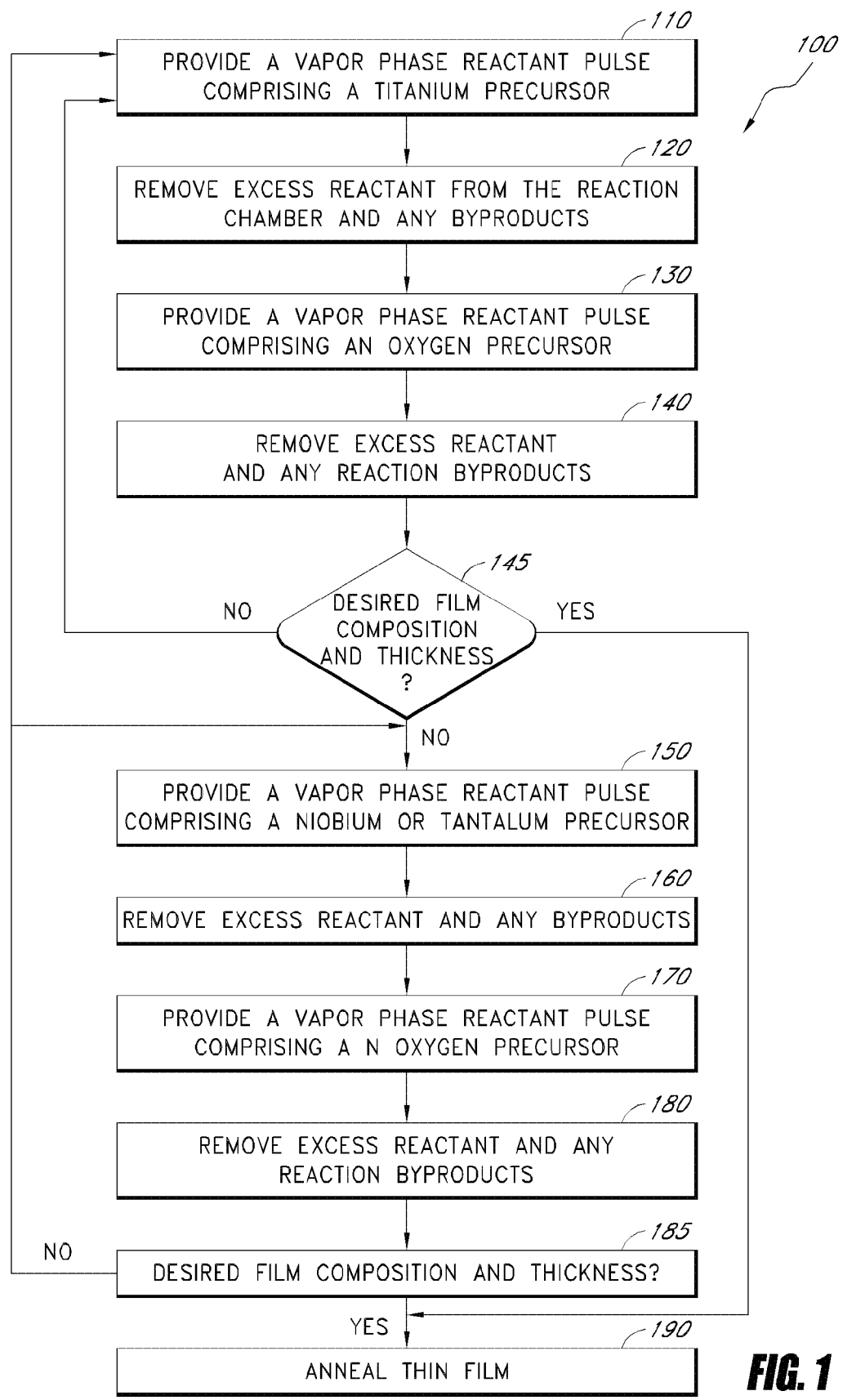
FIG. 1 is a flow chart generally illustrating a method for forming a niobium or tantalum doped titanium oxide thin film in accordance with one embodiment.

While illustrated in the context of forming a conductive interface film in memory capacitors, the skilled artisan will readily appreciate the application of the principles and advantages disclosed herein to various contexts in which conductive titanium oxide films are useful. For example, conductive, transparent titanium oxide films can be used in flat panel displays, LEDs and solar cells.

Conductive doped titanium oxide thin films can be deposited on a substrate by atomic layer deposition (ALD) type processes. In some embodiments, amorphous films of $TiO_2$ and an oxide of the dopant are alternately deposited by ALD. The films are then annealed to crystallize to the anatase phase. For example, alternating layers of amorphous $TiO_2$ and $Nb_2O_5$ can be deposited by ALD and then annealed. In other embodiments, alternating layers of amorphous $TiO_2$ and $Ta_2O_5$ are deposited by ALD and annealed. The thickness of each of the layers can be selected to produce a doped conductive $TiO_2$ film with the desired composition and resistivity, that is, not necessarily a 1:1 ratio of titanium oxide and dopant oxide cycles.

ALD type processes are based on controlled, self-limiting surface reactions of precursor chemicals. Gas phase reactions are avoided by feeding the precursors alternately and sequentially into the reaction chamber. Vapor phase reactants are separated from each other in the reaction chamber, for example, by removing excess reactants and/or reactant byproducts from the reaction chamber between reactant pulses.

Briefly, a substrate is loaded into a reaction chamber and is heated to a suitable deposition temperature, generally at lowered pressure. Deposition temperatures are maintained below the thermal decomposition temperature of the reactants but at a high enough level to avoid condensation of reactants and to provide the activation energy for the desired surface reactions. Of course, the appropriate temperature window for any given ALD reaction will depend upon the surface termination and reactant species involved. Here, the temperature is preferably at or below about 300° C., more preferably at about 200° C.

A first reactant is conducted or pulsed into the chamber in the form of vapor phase pulse and contacted with the surface of the substrate. Conditions are preferably selected such that no more than about one monolayer of the first reactant is adsorbed on the substrate surface in a self-limiting manner. The appropriate pulsing times can be readily determined by the skilled artisan based on the particular circumstances. Excess first reactant and reaction byproducts, if any, are removed from the reaction chamber, such as by purging with an inert gas.

Purging the reaction chamber means that vapor phase precursors and/or vapor phase byproducts are removed from the reaction chamber such as by evacuating the chamber with a vacuum pump and/or by replacing the gas inside the reactor with an inert gas such as argon or nitrogen. Typical purging times are from about 0.05 to 20 seconds, more preferably between about 1 and 10, and still more preferably between about 1 and 2 seconds. However, other purge times can be utilized if necessary, such as where highly conformal step coverage over extremely high aspect ratio structures or other structures with complex surface morphology is needed. Also, batch ALD reactors can utilize longer purging times because of increased volume and surface area.

A second gaseous reactant is pulsed into the chamber where it reacts with the first reactant bound to the surface. Excess second reactant and gaseous byproducts of the surface reaction are removed from the reaction chamber, preferably by purging with the aid of an inert gas and/or evacuation. The steps of pulsing and purging are repeated until a thin film of the desired thickness has been formed on the substrate, with each cycle leaving typically less than or no more than a molecular monolayer.

As mentioned above, each pulse or phase of each cycle is preferably self-limiting. An excess of reactants is supplied in each phase to saturate the susceptible structure surfaces. Surface saturation ensures reactant occupation of all available reactive sites (subject, for example, to physical size or "steric hindrance" restraints) and thus ensures excellent step coverage.

FIG. 1 is a flow chart generally illustrating a method for forming a niobium or tantalum doped titanium oxide thin film in accordance with one embodiment. According to a preferred embodiment, an amorphous titanium oxide thin film is formed on a substrate by an ALD type process 100 comprising multiple titanium oxide and dopant deposition cycles, each titanium oxide deposition cycle comprising:

providing a first vapor phase reactant pulse comprising a titanium precursor into the reaction chamber to form no more than about a single molecular layer of the titanium precursor on the substrate;

removing excess first reactant from the reaction chamber;

providing a second vapor phase reactant pulse comprising an oxygen precursor to the reaction chamber such that the oxygen precursor reacts with the titanium precursor on the substrate;

removing excess second reactant and reaction byproducts, if any, from the reaction chamber.

This can be referred to as the titanium oxide deposition cycle. In some embodiments the process begins with a titanium oxide deposition cycle. First, a vapor phase titanium precursor is provided to the substrate and reaction space 110. The titanium precursor is preferably an alkoxide, halide, alkylamine, betadiketonate, cyclopentadienyl, or cyclopentadienyl derivative compound. Preferred alkoxides include Ti(OMe)$_4$ and Ti(OiPr)$_4$. Preferred halides include compounds having the formula TiX$_4$, where X is a halogen, such as TiCl$_4$, TiBr$_4$, TiF$_4$, and TiI$_4$. Preferably, the titanium precursor is provided such that it forms no more than about a single molecular layer of titanium precursor on the substrate. If necessary, any excess titanium precursor can be purged or removed 120 from the reaction space. In some embodiments, the purge step can comprise stopping the flow of titanium precursor while still continuing the flow of an inert carrier gas such as nitrogen or argon. Next, an oxygen source or precursor is provided 130 to the substrate and reaction chamber. Any of a variety of oxygen precursors can be used, including, without limitation: oxygen, plasma excited oxygen, atomic oxygen, ozone, water, etc. Preferably, the oxygen source is H$_2$O or ozone. A suitable oxygen precursor can be selected by the skilled artisan such that it reacts with the molecular layer of the titanium precursor on the substrate to form titanium oxide. Each titanium oxide deposition cycle typically forms less than or no more than about one molecular layer of titanium oxide. If necessary, any excess reaction byproducts or oxygen precursor can be removed 140 from the reaction space. In some embodiments, the purge step can comprise stopping the flow of oxygen precursor while still continuing the flow of an inert carrier gas such as nitrogen or argon.

The titanium oxide deposition cycle is typically repeated a predetermined number of times. In some embodiments, multiple molecular layers of titanium oxide are formed by multiple deposition cycles. In other embodiments, a molecular layer or less of titanium oxide is formed.

In order to dope the titanium oxide with a dopant such as Nb or Ta, the titanium deposition cycles are alternated with deposition of an oxide comprising the desired dopant, such as Nb$_2$O$_5$ or Ta$_2$O$_5$. Thus, a second ALD cycle is performed, which can be referred to as the dopant oxide deposition cycle.

According to some embodiments, the dopant oxide deposition cycle preferably comprises:

providing a vapor phase reactant pulse comprising a niobium or tantalum precursor to the reaction chamber;

removing excess reactant from the reaction chamber, if any;

providing a vapor phase reactant pulse comprising an oxygen precursor to the reaction chamber such that the oxygen precursor reacts with the niobium or tantalum precursor on the substrate; and removing excess reactant and any reaction byproducts from the reaction chamber.

The titanium oxide cycle and dopant oxide cycles are repeated until a thin film of a desired thickness and composition comprising $Ti_{1-x}Nb_xO_y$ or $Ti_{1-x}Ta_xO_y$, wherein x is between zero and one and wherein y is approximately 2, is obtained.

Also, if the desired film composition and thickness 145 is not met after a deposition cycle then a next step can include providing a vapor phase reactant pulse comprising a titanium precursor 110 or to perform a dopant oxide deposition cycle beginning with step 150, providing a vapor phase reactant pulse comprising a niobium or tantalum precursor.

Multiple titanium oxide layers can also be formed on top of each other or formed in a desired pattern with the dopant oxide layers, such as alternating layers or two titanium oxide layers for every dopant layer, etc. In some embodiments, the TiO$_2$ deposition cycle is repeated for 1 to 100 times and more preferably 1 to 10 and most preferably 1 to 4 times for each dopant oxide cycle. In some embodiments, repeat TiO$_2$ and dopant oxide cycles multiple times before moving to the other. For example, repeating the TiO$_2$ oxide cycle ten times then three cycles of the dopant oxide deposition cycle. In some embodiments, after a doped titanium oxide thin film is deposited to a desired thickness the thin film can be annealed.

In some embodiments, Nb is used as a dopant. The titanium oxide layers can be formed according to the cycles described herein. A niobium precursor is selected from any suitable niobium precursor. Preferably, the niobium precursor or source is an alkoxide such as Nb(OEt)$_5$ or halide such as NbCl$_5$, NbF$_5$. In some embodiments, the niobium precursor is an alkylamine. The skilled artisan can select an appropriate niobium precursor such that it forms no more than about one molecular layer of niobium precursor on the substrate under the reactive conditions. With continued reference to FIG. 1, the niobium precursor is then provided 150 to the reaction chamber such that no more than about a single molecular layer of the niobium precursor is adsorbed on the substrate. If necessary, any excess niobium precursor can be purged or removed 160 from the reaction space. In some embodiments, the removal step 160 can comprise stopping the flow of niobium precursor while still continuing the flow of an inert carrier gas, such as nitrogen. Next, an oxygen precursor is provided to the reaction space 170 such that the oxygen precursor reacts with the niobium precursor on the substrate. Next, any excess oxygen source reactant and/or any reaction byproducts can be purged 180 or removed from the reaction space. In some embodiments, the purge step can comprise stopping the flow of oxygen precursor while still continuing the flow of an inert carrier gas, such as nitrogen or argon. Depending on the desired film composition and thickness 185 there are many options for proceeding after a layer of niobium oxide layer is formed, including: forming another niobium oxide layer, forming a titanium oxide layer by performing a titanium oxide deposition cycle, forming a tantalum oxide layer, or the thin film can be annealed 190.

In some embodiments, Ta is used as a dopant. The titanium oxide layers can be formed according to the cycles described herein. A tantalum oxide ($Ta_2O_5$) layer can be formed directly on top of a titanium oxide layer or dopant oxide layer. First, a tantalum precursor is selected from a variety of suitable tantalum precursors. Preferably, the tantalum precursor or source is an alkoxide, halide, or amine derivative. Preferred alkoxides include $Ta(OEt)_5$. Preferred halides include compounds having the formula $TaX_5$, wherein X is a halide, such as $TaCl_5$, $TaF_5$, and $TaBr_5$. Preferred amine derivatives include alkylamines, for example pentakis(dimethylamino)tantalum (PDMAT), tertiary amyl imido-tris-dimethylamido tantalum (TAIMATA), and tert-butylimidotris(diethylamido)tantalum (TBTDET). The skilled artisan can select an appropriate tantalum precursor such that it forms no more than about one molecular layer of tantalum precursor on the substrate. With continued reference to FIG. 1, the tantalum precursor is then provided 150 to the reaction chamber such that no more than about a single molecular layer of the tantalum precursor is adsorbed on the substrate. If necessary, any excess tantalum precursor can be purged or removed 160 from the reaction space. In some embodiments, the removal step 160 can comprise stopping the flow of tantalum precursor while still continuing the flow of an inert carrier gas such as nitrogen. Next, an oxygen precursor is provided to the reaction space 170 such that the oxygen precursor reacts with the tantalum precursor on the substrate. Next, any excess oxygen source reactant and/or any reaction byproducts can be purged 180 or removed from the reaction space. In some embodiments, the purge step can comprise stopping the flow of oxygen precursor while still continuing the flow of an inert carrier gas such as nitrogen or argon. Depending on the desired film composition and thickness 185 there are many options for proceeding after a layer of tantalum oxide is formed, including: forming another tantalum oxide layer, forming a titanium oxide layer by performing a titanium oxide deposition cycle, forming a niobium oxide layer, or the thin film can be annealed 190.

The dopant oxide deposition cycle is typically repeated a predetermined number of times. In some embodiments, multiple molecular layers of dopant oxide are formed by multiple deposition cycles. In other embodiments, a molecular layer or less of dopant oxide is formed.

However, in some embodiments less than a complete continuous layer of dopant oxide is deposited. If the film is of a desired thickness and composition 185 then the thin film can be annealed 190, discussed in greater detail below.

Removing excess reactants can include evacuating some of the contents of the reaction space or purging the reaction space with helium, nitrogen or any other inert gas. In some embodiments purging can comprise turning off the flow of the reactive gas while continuing to flow an inert carrier gas to the reaction space.

Figure 3:
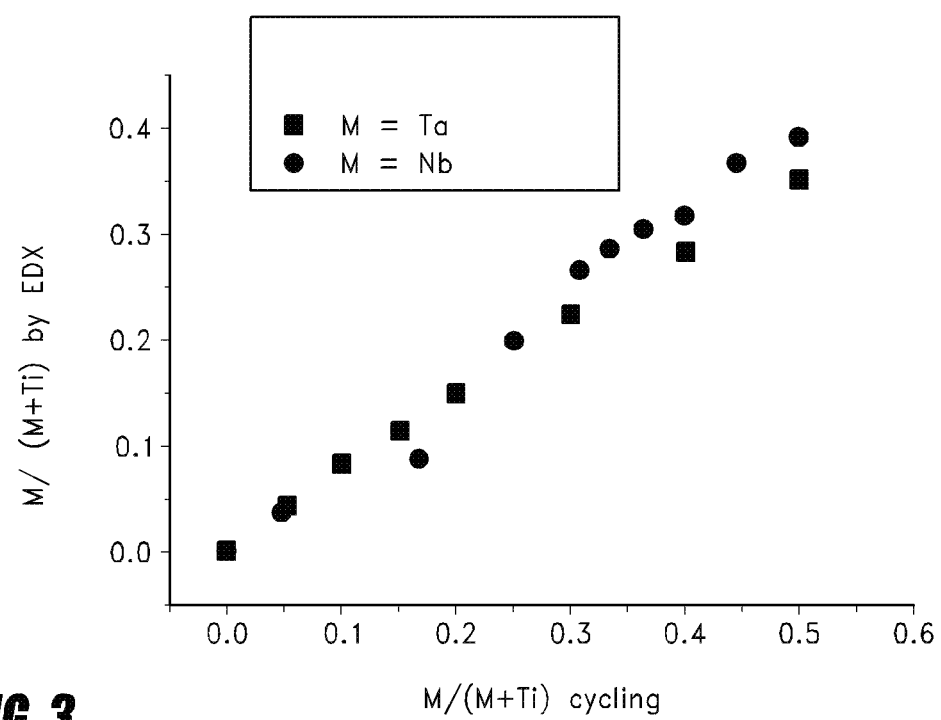
FIG. 3 is a graph illustrating cation ratios for TiNbO and TiTaO films as a function of ALD pulsing ratio.

The number of titanium oxide deposition cycles and dopant oxide deposition cycles can be selected to produce a film of the desired composition and/or resistivity. Typically, the ratio of titanium oxide cycles (consisting of titanium-containing precursor followed by oxygen source pulses) to dopant oxide cycles (consisting of a dopant source followed by the corresponding oxygen source pulses) is about 200:1 to about 1:20, preferably about 100:1 to 1:10, more preferably about 50:1 to about 1:3, and even more preferably 10:1 to 1:1. FIG. 3 illustrates cation ratios for TiNbO and TiTaO films as a function of the ALD pulsing ratio with dopant pulsing ratios illustrated for cation molar concentrations between about 0% to about 50%. The data illustrated in FIG. 3 corresponds to $Ti_{1-x}Nb_xO_2$ thin films with x values between about 0.0 and about 0.50. In some embodiments, x values are around 0.3.

Deposition may begin and end with a titanium oxide deposition cycle or a dopant oxide deposition cycle. For example, the growth can be started with the deposition of titanium oxide and ended with the deposition of dopant oxide. In other embodiments, growth can be started with titanium oxide and ended with titanium oxide.

The precursors employed in the ALD type processes may be solid, liquid or gaseous material under standard conditions (room temperature and atmospheric pressure), provided that the precursors are in vapor phase before it is conducted into the reaction chamber and contacted with the substrate surface. "Pulsing" a vaporized precursor onto the substrate means that the precursor vapor is conducted into the chamber for a limited period of time. Typically, the pulsing time is from about 0.05 to 10 seconds. However, depending on the substrate type and its surface area, the pulsing time may be even higher than 10 seconds. Preferably, for a 300 mm wafer in a single wafer ALD reactor, a metal precursor, such as a Ti, Ta or Nb precursor, is pulsed for from 0.05 to 10 seconds, more preferably for from 0.1 to 5 seconds and most preferably for about 0.3 to 3.0 seconds. An oxygen-containing precursor is preferably pulsed for from about 0.05 to 10 seconds, more preferably for from 0.1 to 5 seconds, most preferably about for from 0.2 to 3.0 seconds. However, pulsing times can be on the order of minutes in some cases. The optimum pulsing time can be readily determined by the skilled artisan based on the particular circumstances.

Suitable dopant precursors may be selected by the skilled artisan. In general, metal compounds where the metal is bound or coordinated to a halide, oxygen, nitrogen, carbon or a combination thereof are preferred. In some embodiments the metal precursors are organic compounds. In another embodiment the metal precursors are halides. In yet another embodiment, all Ti or Ta and dopant precursors are halides, preferably chlorides.

The oxygen source may be an oxygen-containing gas pulse and can be a mixture of oxygen and inactive gas, such as nitrogen or argon. In some embodiments the oxygen source may be a molecular oxygen-containing gas pulse. One source of oxygen may be air. In preferred embodiments, the oxygen source or precursor is water. In some embodiments the oxygen source comprises an activated or excited oxygen species. In some embodiments the oxygen source comprises ozone. The oxygen source may be pure ozone or a mixture of ozone and another gas, for example an inactive gas such as nitrogen or argon. In other embodiments the oxygen source is oxygen plasma.

The oxygen precursor pulse may be provided, for example, by pulsing ozone or a mixture of ozone and another gas into the reaction chamber. In other embodiments, ozone is formed inside the reactor, for example by conducting oxygen containing gas through an arc. In other embodiments an oxygen containing plasma is formed in the reactor. In some embodiments the plasma may be formed in situ on top of the substrate or in close proximity to the substrate. In other embodiments the plasma is formed upstream of the reaction chamber in a remote plasma generator and plasma products are directed to the reaction chamber to contact the substrate. As will be appreciated by the skilled artisan, in the case of remote plasma the pathway to the substrate can be optimized to maximize electrically neutral species and minimize ion survival before reaching the substrate.

The mass flow rate of the precursors can also be determined by the skilled artisan. In one embodiment, for deposition on 300 mm wafers the flow rate of metal precursors is preferably between about 1 and 1000 sccm without limitation, more preferably between about 100 and 500 sccm. The mass flow rate of the metal precursors is usually lower than the mass flow rate of the oxygen source, which is usually between about 10 and 10000 sccm without limitation, more preferably between about 100-2000 sccm and most preferably between 100-1000 sccm.

The pressure in the reaction chamber is typically from about 0.01 and 20 mbar, more preferably from about 1 to about 10 mbar. However, in some cases the pressure will be higher or lower than this range, as can be readily determined by the skilled artisan.

Before starting the deposition of the film, the substrate is typically heated to a suitable growth temperature. Preferably, the growth temperature of the metal oxide thin film is less than about 300° C., more preferably less than about 250° C. and even more preferably less than about 200° C. Typically, the growth temperature is less than the crystallization temperature for the deposited materials such that an amorphous thin film is formed. The preferred deposition temperature may vary depending on a number of factors such as, and without limitation, the reactant precursors, the pressure, flow rate, the arrangement of the reactor, crystallization temperature of the deposited thin film, and the composition of the substrate including the nature of the material to be deposited on. The specific growth temperature may be selected by the skilled artisan using routine experimentation.

The deposition cycles can be repeated a predetermined number of times or until a desired thickness is reached. Preferably, the thin films are between about 2 nm and 200 nm thick.

Following deposition, layers comprising mostly amorphous titanium oxide and dopant oxide are annealed to crystallize the film to the anatase phase, resulting in an electrically conductive titanium oxide anatase film. However, as-deposited films are somewhat electrically conductive and in some cases those could be used without annealing. Thus, an amorphous structure is first provided and the conductive phase can be obtained by annealing in the presence of an inert atmosphere (such as a nitrogen atmosphere), an oxygen-free atmosphere, or a reducing atmosphere, such as a forming gas atmosphere (5% hydrogen 95% nitrogen), at temperatures of at least 400° C., in particular in between about 500° C. and 800° C., and preferably about 600° C. These temperatures and atmospheres are similar to annealing temperatures and atmospheres for $SrTiO_3$, $BaTiO_3$ and $(Sr,Ba)TiO_3$. Typically, annealing lasts from a few minutes to more than an hour depending on the thickness of the thin film and annealing process conditions. Ultra-thin films of a few nanometers thick may crystallize in seconds. The composition of the films and the resistivity can be controlled by adjusting the thickness of the layers and the concentration of dopant.

Figure 4:
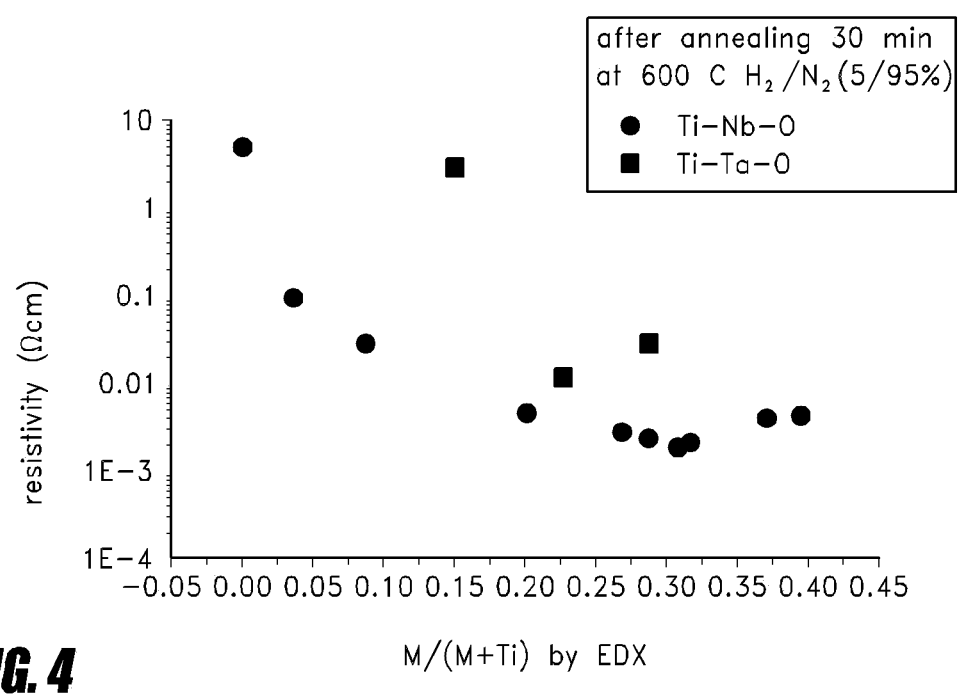
FIG. 4 is a graph illustrating resistivities of TiNbO and TiTaO films formed by ALD.

FIG. 4 illustrates the resistivities of various TiNbO and TiTaO thin films after annealing for 30 minutes in forming gas (5% hydrogen/95% nitrogen) at 600° C. The y-axis represents resistivity in $\Omega cm$ and the x-axis represents the atomic ratio of dopant, represented by M, to total amount of metal (M+Ti). The lowest resistivity of 0.0019 $\Omega cm$ was measured for a $Ti_{0.69}Nb_{0.31}O_2$ thin film. The $Ti_{1-x}Nb_xO_2$ thin films with x values between about 0.20 and 0.40 had the lowest resistivities after annealing. Generally, the titanium oxide thin films doped with niobium had lower resistivities than the thin films doped with tantalum.

Figure 7:
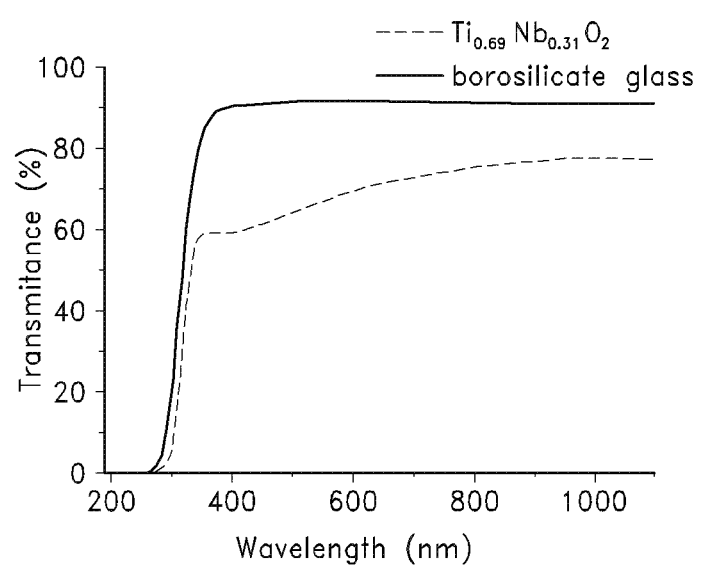
FIG. 7 is a graph illustrating the optical transmittance of a $Ti_{0.69}Nb_{0.31}O_2$ thin film formed by ALD after annealing.

Anatase titanium oxide also has enhanced optical transmission properties. Titanium oxide in the anatase phase has good optical transmission properties making it transparent. In some embodiments, doped titanium oxide thin films in the anatase phase can have optical transmittance greater than about 60% in the visible region. Optical transmittance can be measured, for example, by using a UV/VIS-spectrometer. The optical transmittance of an exemplary $Ti_{0.69}Nb_{0.31}O_2$ thin film is illustrated in FIG. 7 and discussed in greater detail below.

In some embodiments, electrically conductive $Ti_{1-x}Nb_xO_y$ or $Ti_{1-x}Ta_xO_y$ thin films are formed by oxidizing corresponding doped nitrides, such as $Ti_{1-x}Nb_xN_y$ or $Ti_{1-x}Ta_xN_y$. In some embodiments, a doped nitride thin film is deposited by an ALD type process. The doped nitride film may comprise, for example, $Ti_{1-x}Nb_xN_y$ or $Ti_{1-x}Ta_xN_y$. Preferably, the doped nitride thin film is deposited by an ALD type process comprising a titanium nitride deposition cycle and a dopant nitride deposition cycle. The titanium deposition cycle preferably comprises alternating and sequential pulses of a titanium source and nitrogen source. In some embodiments, the titanium nitride deposition cycle comprises:

providing a first vapor phase reactant pulse comprising a titanium precursor into the reaction chamber to form no more than about a single molecular layer of the titanium precursor on the substrate;

removing excess first reactant from the reaction chamber;

providing a second vapor phase reactant pulse comprising a nitrogen precursor to the reaction chamber such that the nitrogen precursor reacts with the titanium precursor on the substrate;

removing excess second reactant and reaction byproducts, if any, from the reaction chamber.

The titanium precursor is preferably halide, alkylamine, betadiketonate, cyclopentadienyl, or cyclopentadienyl derivative compound. Preferred halides include compounds having the formula $TiX_4$, where X is a halogen, such as $TiCl_4$, $TiBr_4$, $TiF_4$, and $TiI_4$. Preferably, the titanium precursor is provided such that it forms no more than about a single molecular layer of titanium precursor on the substrate. If necessary, any excess titanium precursor can be purged or removed from the reaction space.

Suitable nitrogen precursors include, but are not limited to: $NH_3$, $NH_3$-plasma and radicals, $N_2/H_2$-plasma and radicals, atomic N and H, and ammonia derivatives, such as hydrazine. Preferably, the nitrogen source is ammonia. A suitable nitrogen precursor can be selected by the skilled artisan such that it reacts with the molecular layer of the titanium precursor on the substrate to form titanium nitride.

Each titanium nitride deposition cycle typically forms about a fraction of one molecular layer of titanium nitride. If necessary, any excess reaction byproducts or nitrogen precursor can be removed from the reaction space. In some embodiments, the purge steps, in which excess reactant and/or reaction byproducts are removed from the reaction chamber, can comprise stopping the flow of a reactant while still continuing the flow of an inert carrier gas such as nitrogen or argon.

The titanium nitride deposition cycle is typically repeated a predetermined number of times relative to each dopant nitride deposition cycle. In some embodiments, multiple molecular layers of titanium nitride are formed by multiple titanium nitride deposition cycles prior to a dopant nitride deposition cycle. In other embodiments, a molecular layer or less of titanium nitride is formed.

In order to dope the titanium nitride with a dopant such as Nb or Ta, the titanium nitride deposition cycles are alternated with deposition of a nitride comprising the desired dopant, such as NbN, $NbN_x$, $Nb_3N_5$, TaN, $TaN_x$ or $Ta_3N_5$. Thus, a second ALD cycle can be referred to as the dopant nitride deposition cycle.

According to some embodiments, the dopant nitride deposition cycle preferably comprises:
  providing a first vapor phase reactant pulse comprising a niobium or tantalum (or other dopant) precursor to the reaction chamber;
  removing excess first reactant from the reaction chamber, if any;
  providing a second vapor phase reactant pulse comprising a nitrogen precursor to the reaction chamber such that the nitrogen precursor reacts with the niobium or tantalum precursor on the substrate; and
  removing excess second reactant and any reaction byproducts from the reaction chamber.

The titanium nitride cycle and dopant nitride cycles are repeated for a period of time and at a ratio such that a thin film of a desired thickness and composition is obtained. The number of titanium nitride deposition cycles and dopant nitride deposition cycles in the process can be selected to produce a film of the desired composition and/or resistivity. In some embodiments the thin film comprises $Ti_{1-x}Nb_xN_y$ or $Ti_{1-x}Ta_xN_y$, wherein x is between zero and one and wherein y is between about 1 and about 2. The order and ratio of titanium nitride to dopant nitride cycles can be varied based on the desired x and y values of the resulting $Ti_{1-x}Nb_xN_y$ or $Ti_{1-x}Ta_xN_y$ thin film.

Typically, the ratio of titanium nitride cycles (consisting of titanium-containing precursor followed by nitrogen source pulses) to dopant nitride cycles (consisting of a dopant source followed by the corresponding nitrogen source pulses) is about 200:1 to about 1:20, preferably about 100:1 to 1:10, more preferably about 50:1 to about 1:3, and even more preferably 10:1 to 1:1.

In some embodiments the process begins with a titanium nitride deposition cycle while in other embodiments the process may begin with a dopant nitride deposition cycle. Similarly, the process may end with either a titanium nitride or dopant nitride deposition cycle.

Also, if the desired film composition and thickness is not met after a particular deposition cycle then a next step can include beginning another titanium nitride deposition cycle by providing a vapor phase reactant pulse comprising a titanium precursor or beginning another dopant nitride deposition cycle by providing a vapor phase reactant pulse comprising a niobium or tantalum precursor.

Multiple titanium nitride layers can also be formed on top of each other or formed in a desired pattern with the dopant nitride layers, such as alternating layers or two titanium nitride layers for every dopant layer, etc. In some embodiments, the titanium nitride deposition cycle is repeated 1 to 100 times and more preferably 1 to 10 and most preferably 1 to 4 times for each dopant nitride cycle. In some embodiments, the titanium nitride and dopant nitride cycles are repeated multiple times before moving to the other. For example, the titanium nitride cycle can be repeated ten times followed by three cycles of the dopant nitride deposition cycle. The dopant nitride deposition cycle is typically repeated a predetermined number of times. In some embodiments, multiple molecular layers of dopant nitride are formed by multiple deposition cycles. In other embodiments, a molecular layer or less of dopant nitride is formed.

In some embodiments, after a doped titanium nitride thin film is deposited to a desired thickness the thin film can be annealed as described above.

Suitable Nb and Ta precursors for the dopant nitride deposition cycle are described above in the description of the dopant oxide deposition cycle. Suitable nitrogen precursors include, but are not limited to: $NH_3$, $NH_3$-plasma and radicals, $N_2/H_2$-plasma and radicals, atomic N and H, and ammonia derivatives, such as hydrazine.

In both the titanium nitride and dopant nitride deposition cycles, removing excess reactants can include evacuating some of the contents of the reaction space or purging the reaction space with helium, nitrogen or any other inert gas. In some embodiments purging can comprise turning off the flow of a reactant gas while continuing to flow an inert carrier gas to the reaction space.

Once a doped thin film of the desired composition is formed, the film can be further processed depending on the desired properties of the thin film. In some embodiments, all or part of the thin $Ti_{1-x}Nb_xN_y$ or $Ti_{1-x}Ta_xN_y$ thin film can be oxidized. The thin film can be oxidized using oxygen sources including, without limitation: water, ozone, oxygen, oxygen plasma, oxygen radicals, atomic oxygen, alcohol, and $H_2O_2$.

In some embodiments the thin film is oxidized in a separate oxidation step by exposure to an oxidant. A wide range of temperatures and times can be used in an oxidation step depending on the specific oxidant and desired thickness of the oxide layer. Preferably the temperature during the oxidation step is between 20° C. and 500° C. For example, in some embodiments with oxygen sources such as, ozone, oxygen plasma, oxygen radicals and atomic oxygen oxidation can occur at room temperature (20° C.) or even below 20° C. The temperature for oxidation with oxygen, water, alcohol, and $H_2O_2$ is preferably from about 20° C. to 1000° C., more preferably from about 100° C. to about 800° C. and most preferably from about 100° C. to 500° C. The oxidation step time depends on the temperature and oxygen source. The oxidation step can occur on the order of seconds or minutes, preferably from 0.1 to 180 seconds, more preferably from 1 to 60 seconds.

In other embodiments, the doped titanium nitride thin film is oxidized during deposition of the next layer, such as an ultra-high-k layer. In some embodiments, the doped titanium nitride thin film is oxidized during an annealing step.

In some embodiments, the thin film can be annealed after it is oxidized. Annealing the thin film after oxidation can increase the crystallinity of the film. Annealing can be carried out under conditions as described above.

Conductive titanium oxide films may be used, for example, as an interface layer between a high-k material and a metal electrode in a memory capacitor. In some embodiments, a memory capacitor suitable for use in an integrated circuit is formed by a method comprising:

depositing a bottom electrode;
depositing a conductive titanium oxide layer doped with a group V metal by
ALD on the bottom electrode;
depositing an ultra-high-k layer directly over and contacting the titanium oxide layer; and
depositing a top electrode directly over and contacting the ultra-high-k layer.

Figure 2:
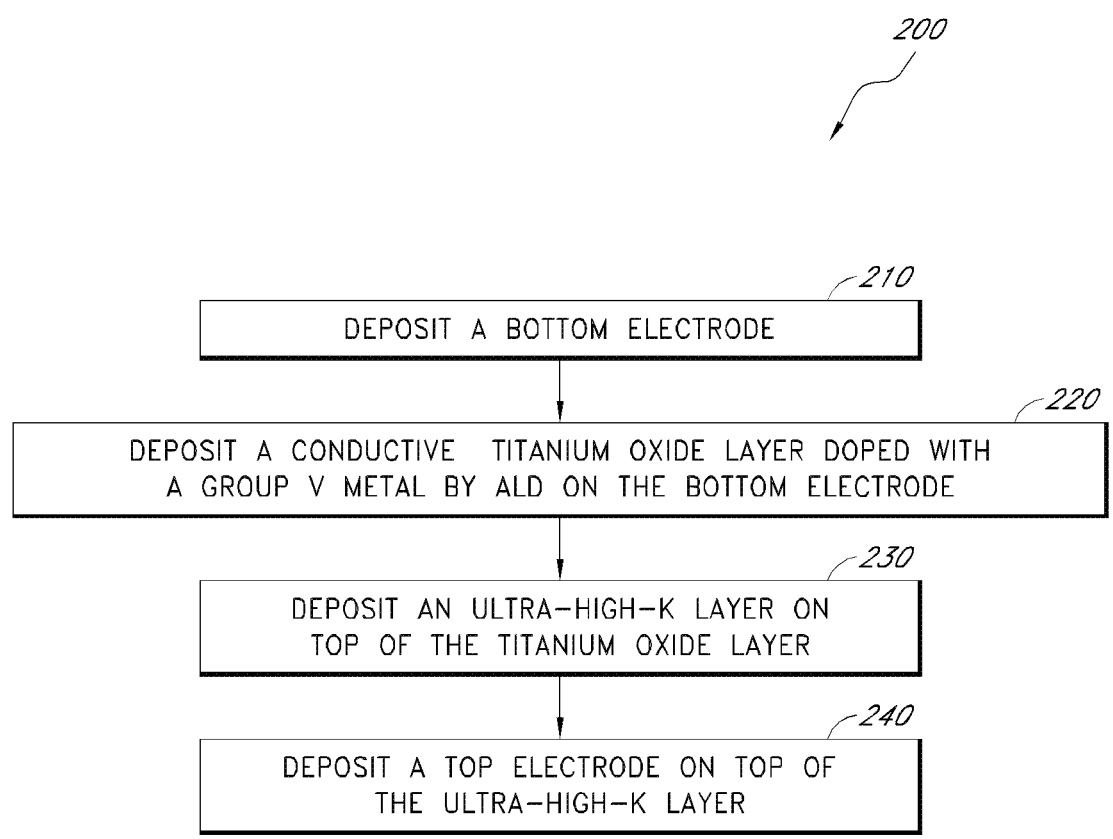
FIG. 2 is a flow chart generally illustrating a method for forming a memory capacitor in an integrated circuit in accordance with one embodiment.

FIG. 2 is a flow chart generally illustrating a method 200 for forming a memory capacitor in an integrated circuit in accordance with one embodiment. The first illustrated step is to deposit a bottom electrode 210. In some embodiments the bottom electrode is deposited by ALD. The bottom electrode can be formed of any suitable material. In some embodiments, the bottom electrode comprises a noble metal, noble metal oxide or nitride, such as: Ru, $RuO_2$, $IrO_2$, W, Ir, Pt, $SrRuO_3$, Rh, Pd, Ag, Cu, Re, Os or Au or mixtures thereof or TiN, NbN, ZrN, HfN, MoN, WN, VN or TaN or mixtures thereof, etc.

Suitable precursors for ALD of noble metal containing electrodes are described, for example, in U.S. Pat. No. 6,824,816 by Aaltonen et al and U.S. Patent Application Publication No. 2007-0014919 by Hamalainen et al. The disclosures of both are hereby incorporated by reference in their entireties. Although Hamalainen et al describes noble metal precursors in the context of noble metal oxide thin film deposition, the noble metal precursors described are also suitable for the deposition of noble metal thin films.

Preferable Ti precursors for depositing TiN, $Ti_{1-x}Nb_xN_y$ or $Ti_{1-x}Ta_xN_y$ electrodes include halides, cyclopentadienyl compounds, and cyclopentadienyl derivative compounds. Preferred halides include compounds having the formula $TiX_4$, where X is a halogen, such as $TiCl_4$, $TiBr_4$, $TiF_4$, and $TiI_4$. Suitable nitrogen precursors include, but are not limited to: $NH_3$, $NH_3$-plasma and radicals, $N_2/H_2$-plasma and radicals, atomic N and H, and ammonia derivatives, such as hydrazine.

Preferably, the tantalum precursor for depositing TaN or $Ti_{1-x}Ta_xN_y$ electrodes includes halides or amine derivatives. Preferred halides include compounds having the formula $TaX_5$, wherein X is a halide, such as $TaCl_5$, $TaF_5$, and $TaBr_5$. Preferred amine derivatives include alkylamines, for example pentakis(dimethylamino)tantalum (PDMAT), tertiary amyl imido-tris-dimethylamido tantalum (TAIMATA), and tert-butylimidotris(diethylamido)tantalum (TBTDET). Suitable nitrogen precursors include, but are not limited to: $NH_3$, $NH_3$-plasma and radicals, $N_2/H_2$-plasma and radicals, atomic N and H, and ammonia derivatives, such as hydrazine.

Preferably, the niobium precursor for depositing NbN or $Ti_{1-x}Nb_xN_y$ electrodes includes halides or amine derivatives. Preferred halides include compounds having the formula $TaX_5$, wherein X is a halide, such as $TaCl_5$, $TaF_5$, and $TaBr_5$. Preferred amine derivatives include alkylamines, for example pentakis(dimethylamino)tantalum (PDMAT), tertiary amyl imido-tris-dimethylamido tantalum (TAIMATA), and tert-butylimidotris(diethylamido)tantalum (TBTDET). Suitable nitrogen precursors include, but are not limited, $NH_3$, $NH_3$-plasma and radicals, $N_2/H_2$-plasma and radicals, atomic N and H, and ammonia derivatives, such as hydrazine.

The next step is to deposit a conductive titanium oxide layer doped with a group V metal 220 by ALD on the bottom electrode. In some embodiments, there may be a layer between the bottom electrode and conductive titanium oxide layer, such as an ultra-high-k layer. The deposition of the conductive titanium oxide layer 220 can include any of the methods described herein. The group V metal can include tantalum, niobium, and vanadium. Typically, the thin film formed in step 220 is annealed at temperatures above 500° C., and preferably above 600° C. As discussed above, annealing changes the crystalline configuration of the doped titanium oxide thin film to an anatase crystalline configuration. The anatase crystalline configuration has great conductive properties. Preferably, an ultra-high-k layer is then deposited in a process step 230 directly over and contacting the conductive titanium oxide layer 220. However, in some embodiments of a memory capacitor a dielectric layer is not deposited between the conductive titanium oxide layer and top electrode.

Preferably, the ultra-high-k layer comprises a material with a dielectric constant greater than 10, more preferably greater than 20 and most preferably greater than 40. In some embodiments the ultra-high-k layer has a dielectric constant greater than 100. More preferably, the ultra-high-k layer comprises titanium, such as $PbTiO_3$, $PbZr_xTi_{1-x}O_3$, $SrTiO_3$, $BaTiO_3$, $SrBaTiO_3$, BiTaO and SrBiTaO based compounds. In some embodiments the ultra-high K layer is deposited by ALD. Suitable precursors for the ALD of ultra-high k layers are described, for example, in U.S. Pat. No. 7,108,747 to Leskela et al, U.S. patent application Ser. No. 10/696,591 by Vehkamaki et al, and in U.S. patent application Ser. No. 11/318,092 by Hatanpaa et al, which are all hereby incorporated by reference in their entirety.

Next, a top electrode is deposited 240 directly over and contacting the ultra-high-k layer, thereby forming a memory capacitor. In some embodiments the top electrode is deposited by ALD. In some embodiments, the top electrode can comprise a noble metal or nitride, such as: Ru, $RuO_2$, $IrO_2$, W, Ir, Pt, $SrRuO_3$, Rh, Pd, Ag, Cu, Re, Os or Au or mixtures thereof or TiN, NbN, ZrN, HfN, MoN, WN, VN or TaN or mixtures thereof, etc.

Conductive titanium oxide films can also be used in other capacitor configurations. In some embodiments, a capacitor for use in an integrated circuit is formed by a method comprising:

depositing a bottom electrode;
depositing a first conductive titanium oxide layer doped with a group V metal by ALD on the bottom electrode;
depositing an ultra-high-k layer directly over and contacting the first conductive titanium oxide layer;
depositing a second conductive titanium oxide layer doped with a group V metal by ALD on the ultra-high-k layer; and
depositing a top electrode directly over and contacting the second conductive titanium oxide layer.

In some embodiments, a capacitor for use in an integrated circuit is formed by the method comprising:

depositing a bottom electrode;
depositing an ultra-high-k layer directly over and contacting the bottom electrode;
depositing a conductive titanium oxide layer doped with a group V metal by ALD on the ultra-high-k layer; and
depositing a top electrode directly over and contacting the conductive titanium oxide layer.

In other embodiments, a conductive titanium oxide layer in a capacitor structure can be formed by oxidizing all or part of a doped titanium nitride layer, as described above. In some embodiments, a doped titanium nitride layer can be oxidized by providing an oxygen source in a separate oxidation step. In other embodiments, a doped titanium nitride layer can be oxidized during an annealing step or during deposition of a subsequent layer, such as a layer comprising an ultra-high-k material.

In some embodiments the doped titanium nitride layer is the bottom electrode of a capacitor and during deposition of an overlying ultra-high-k layer, some fraction of the titanium nitride layer surface may oxidize to form an interfacial layer or interfacial composition of conductive doped titanium oxide between the bottom electrode and ultra-high-k layer. In some embodiments the $Ti_{1-x}Nb_xO_y$ or $Ti_{1-x}Ta_xO_y$ functions as the electrode.

In some embodiments, a capacitor for use in an integrated circuit is formed by a method comprising:
 depositing a layer comprising $Ti_{1-x}Nb_xN_y$ or $Ti_{1-x}Ta_xN_y$;
 depositing an ultra-high-k layer directly over and contacting the layer comprising $Ti_{1-x}Nb_xN_y$ or $Ti_{1-x}Ta_xN_y$, wherein an interfacial layer comprising conductive $Ti_{1-x}Nb_xO_y$ or $Ti_{1-x}Ta_xO_y$ is formed between the ultra-high-k layer and the $Ti_{1-x}Nb_xN_y$ or $Ti_{1-x}Ta_xN_y$ layer from all or part of the $Ti_{1-x}Nb_xN_y$ or $Ti_{1-x}Ta_xN_y$ layer; and
 depositing a top electrode directly over and contacting the ultra-high-k layer.

In some embodiments, a capacitor for use in an integrated circuit is formed by the method comprising:
 depositing a layer comprising $Ti_{1-x}Nb_xN_y$ or $Ti_{1-x}Ta_xN_y$;
 depositing an ultra-high-k layer on top of the $Ti_{1-x}Nb_xN_y$ or $Ti_{1-x}Ta_xN_y$, wherein a conductive $Ti_{1-x}Nb_xO_y$ or $Ti_{1-x}Ta_xO_y$ interfacial layer is formed by oxidizing at least a portion of the $Ti_{1-x}Nb_xN_y$ or $Ti_{1-x}Ta_xN_y$; and
 depositing a layer comprising $Ti_{1-x}Nb_xN_y$ or $Ti_{1-x}Ta_xN_y$ on top of the ultra-high-k layer, wherein a conductive $Ti_{1-x}Nb_xO_y$ or $Ti_{1-x}Ta_xO_y$ layer is formed between the ultra-high-k layer and $Ti_{1-x}Nb_xN_y$ or $Ti_{1-x}Ta_xN_y$ layer from all or part of the $Ti_{1-x}Nb_xN_y$ or $Ti_{1-x}Ta_xN_y$ layer.

In some embodiments the $Ti_{1-x}Nb_xN_y$ or $Ti_{1-x}Ta_xN_y$ layer is oxidized during deposition of the ultra-high k layer.

In some embodiments, a capacitor for use in an integrated circuit is formed by the method comprising:
 depositing a bottom electrode;
 depositing an ultra-high-k layer on top of the bottom electrode; and
 depositing a layer comprising $Ti_{1-x}Nb_xN_y$ or $Ti_{1-x}Ta_xN_y$ on top of the ultra-high-k layer and forming a conductive $Ti_{1-x}Nb_xO_y$ or $Ti_{1-x}Ta_xO_y$ top electrode over the ultra-high-k layer from all or part of the $Ti_{1-x}Nb_xN_y$ or $Ti_{1-x}Ta_xN_y$.

Examples of suitable reactors that may be used include commercially available ALD equipment such as the F-120® reactor, Pulsar® reactor and Advance® 400 Series reactor, available from ASM America, Inc of Phoenix, Ariz. and ASM Europe B.V., Almere, Netherlands. In addition to these ALD reactors, many other kinds of reactors capable of ALD growth of thin films, including CVD reactors equipped with appropriate equipment and means for pulsing the precursors can be employed. Preferably, reactants are kept separate until reaching the reaction chamber, such that shared lines for the precursors are minimized. However, other arrangements are possible, such as the use of a pre-reaction chamber as described in U.S. application Ser. No. 10/929,348, filed Aug. 30, 2004 and Ser. No. 09/836,674, filed Apr. 16, 2001, the disclosures of which are incorporated herein by reference.

The growth processes can optionally be carried out in a reactor or reaction space connected to a cluster tool. In a cluster tool, because each reaction space is dedicated to one type of process, the temperature of the reaction space in each module can be kept constant, which improves the throughput compared to a reactor in which is the substrate is heated up to the process temperature before each run.

A stand-alone reactor can be equipped with a load-lock. In that case, it is not necessary to cool down the reaction space between each run.

The following non-limiting examples illustrate certain preferred embodiments of the invention. They were carried out in an F-120™ ALD reactor supplied by ASM Microchemistry Oy, Espoo.

Example 1

Alternating layers of $TiO_2$ and $Nb_2O_5$ were deposited by ALD from $Ti(OMe)_4$ at 130° C. and water and $Nb(OEt)_5$ at 90° C. and water, respectively at 215° C. By controlling the number of cycles of $TiO_2$ and $Nb_2O_5$ deposition, the composition of the films was varied. FIG. 3 illustrates cation ratios of TiNbO and TiTaO films as a function of ALD pulsing ratio. The amorphous thin films formed by the ALD processes were insulators because no resistivity reading registered on the four point probe used to measure resistivity. Subsequently, the amorphous films were annealed in forming gas (5% $H_2$, 95% $N_2$) at 600° C. for 30 minutes. The thin films became conductive after annealing. Exemplary resistivities for the various compositions are illustrated in FIG. 4. A resistivity of 0.0019 Ωcm was measured for a $Ti_{0.69}Nb_{0.31}O_2$ film.

Figure 5:
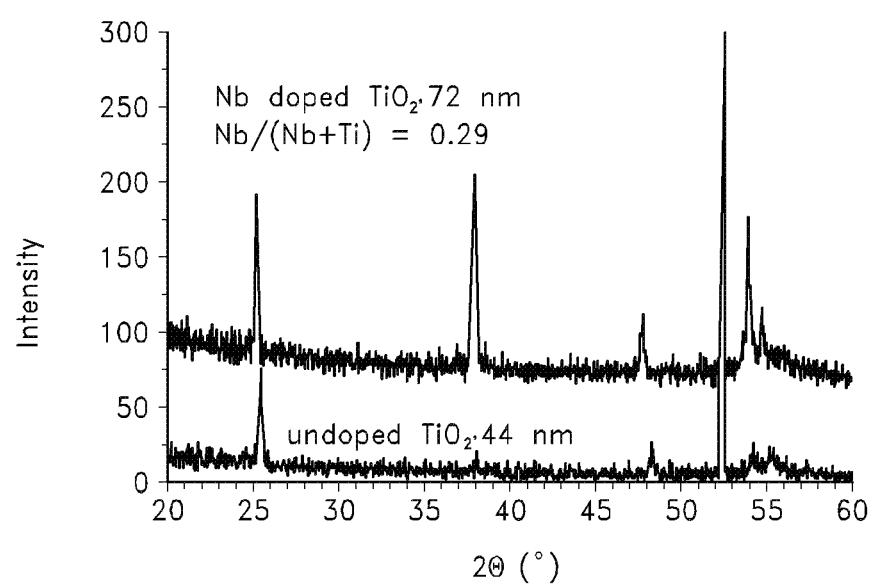
FIG. 5 is an x-ray diffractogram of a $TiO_2$ and $TiO_2$ film doped with niobium prepared by ALD.
Figure 6:
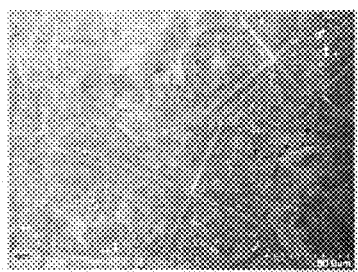
FIG. 6 is a field emission scanning electron microscope (FESEM) image of a $Ti_{0.69}Nb_{0.31}O_2$ film after annealing in forming gas at 600° C.

Additional data for the $Ti_{0.69}Nb_{0.31}O_2$ film is illustrated in FIGS. 5 and 6. FIG. 5 represents an x-ray diffractogram of an undoped $TiO_2$ film and a $Ti_{0.69}Nb_{0.31}O_2$ film. The undoped $TiO_2$ film is closer to the x-axis and has a major peak around a 2θ value of about 25°. The 52° peak is assumed to belong to the Si substrate. The $Ti_{0.69}Nb_{0.31}O_2$ film, illustrated further away from the x-axis shows major peaks at 2θ values of 25°, 37.5°, 48°, and 54°. All 2θ values represent the anatase phase of titanium oxide. The anatase phase has good electrical conductivity when doped with Nb.

The crystalline structure for a $Ti_{0.69}Nb_{0.31}O_2$ film is illustrated in FIG. 6, which is an emission scanning electron microscope (FESEM) image of the film after annealing at 600° C. in forming gas (5% hydrogen 95% nitrogen). However, the crystallization behavior was unusual because very large grains with highly regular cross and wavy patterns were formed. The image suggests that the film crystallized explosively, which might assist the crystallization of ultra-high-k layers.

Further analysis of the thin film via energy dispersive x-ray analysis (EDX) revealed that the composition of the film was very uniform. Cross patterns could not be observed by atomic force microscopy (AFM), either. It is likely that the FESEM images are thus due to crystal orientation contrast. $Ti_{1-x}Nb_xO_2$ thin films with x values in the range of about 0.20 to about 0.40 also exhibited similar crystallization patterns. As illustrated in FIG. 4, the film resistivity was also at a minimum around this range.

FIG. 7 is a graph illustrating the optical transmittance of a $Ti_{0.69}Nb_{0.31}O_2$ film after annealing in forming gas at 600° C. The optical transmittance was measured using a UV/VIS-spectrometer. The $Ti_{0.69}Nb_{0.31}O_2$ thin film measured was formed on borosilicate glass and was approximately 42 nm thick. FIG. 7 illustrates that the TiNbO thin film has good optical transmittance of around 60% and higher in the visible light spectrum, which is typically from around 380 nm to around 750 nm. The transmittance of the bare borosilicate glass substrate is also plotted in FIG. 7.

Figure 8:
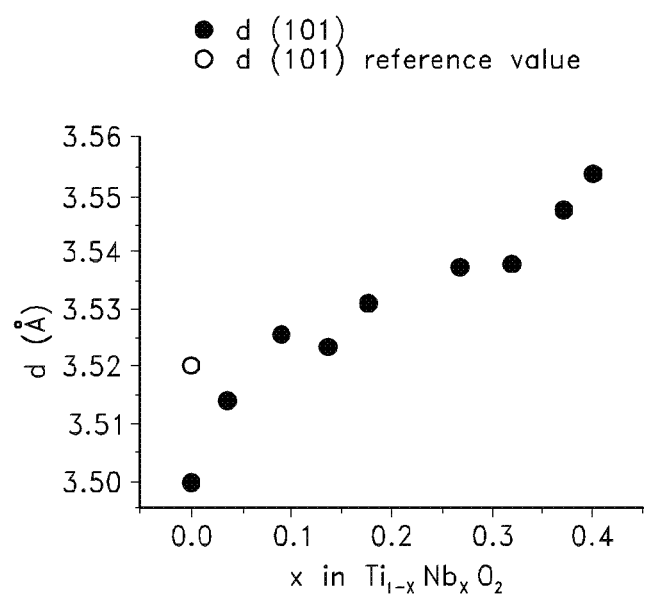
FIG. 8 is a graph illustrating x-ray diffractogram data for TiNbO thin films formed by ALD.

The crystalline properties of the TiNbO thin films were also measured using an x-ray diffractogram, as illustrated in FIG. 8. The d(101) values in angstroms for $Ti_{1-x}Nb_xO_2$ thin films with x values from zero to about 0.4 are illustrated in FIG. 8. The d(101) values increase as the Nb content increases in the thin films indicating good solubility of Nb ions in $TiO_2$.

Figure 9:
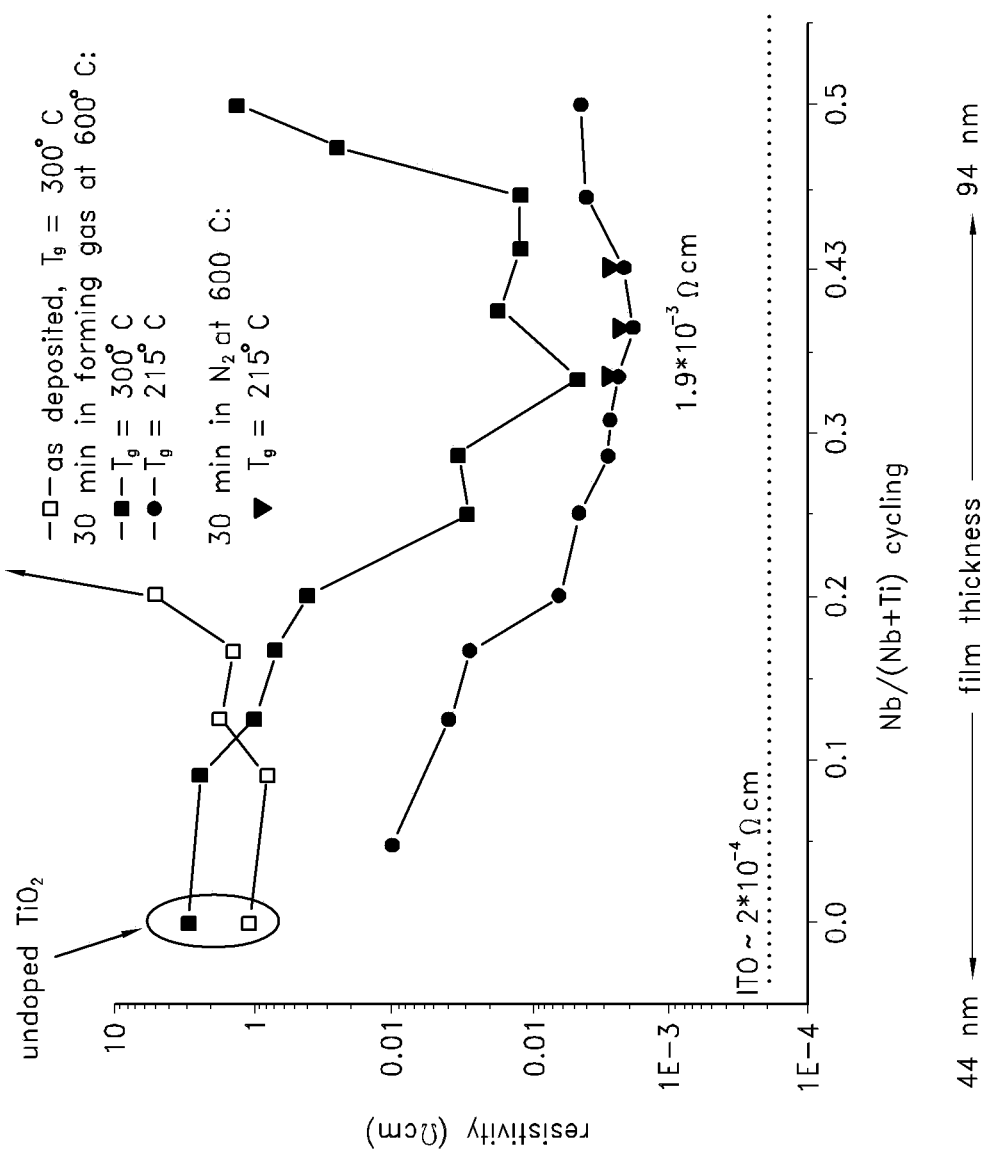
FIG. 9 is a graph illustrating resistivities for TiNbO thin films formed by ALD under different deposition and annealing conditions.

FIG. 9 illustrates resistivities for TiNbO thin films deposited at 300° C. without annealing (white squares), deposited at 215° C. and annealed in forming gas at 600° C. (circles), deposited at 300° C. and annealed in forming gas at 600° C. (squares), and deposited at 215° C. and annealed in nitrogen at 600° C. (triangles). The dashed line at the bottom of the graph illustrates the resistivity for ITO thin films of about 0.0002 Ω-cm. The film thickness generally increased with Nb content from about 44 nm for undoped $TiO_2$ to about 94 nm for the more heavily doped TiNbO thin films. The amorphous TiNbO thin film (no annealing) typically had the highest resistivities. The annealed TiNbO thin films deposited at 215° C. had lower resistivity values than the film formed at 300° C. The TiNbO thin films annealed in forming gas had slightly lower resistivities than those annealed in the presence of nitrogen. The minimum resistivity measured was 0.0019 Ω-cm for a $Ti_{0.69}Nb_{0.31}O_2$ thin film.

Figure 10:
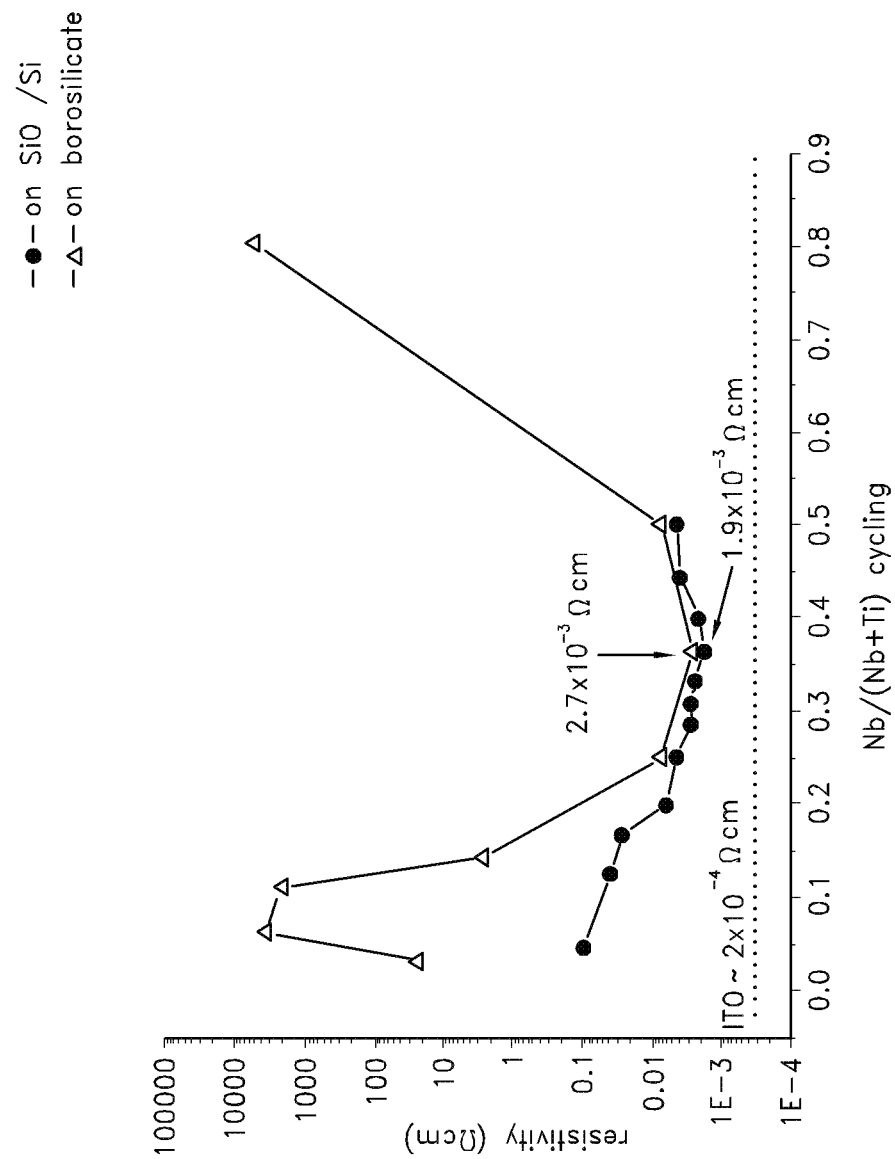
FIG. 10 is a graph illustrating resistivities for TiNbO thin films formed by ALD on different substrates.

FIG. 10 illustrates resistivities of TiNbO thin films deposited on silicon and borosilicate glass. The TiNbO thin films were deposited at 215° C. using $Ti(OMe)_4$, $Nb(OEt)_5$, and water as Ti, Nb, and oxygen precursors. The thin films were subsequently annealed for 30 minutes in forming gas at 600° C. The lowest resistivity measure for the TiNbO thin film deposited on borosilicate glass was 0.0027 Ω-cm, higher than the lowest resistivity of 0.0019 Ω-cm measured for a TiNbO thin film deposited on silicon dioxide.

Example 2

Amorphous layers of $TiO_2$ and $Ta_2O_5$ were deposited by ALD from $Ti(OMe)_4$ at 130° C. and water and $Ta(OEt)_5$ at 105° C. and water, respectively with substrate temperatures around 215° C. Subsequently, the amorphous films were annealed in forming gas (5% $H_2$, 95% $N_2$) at greater than 600° C. forming a crystalline anatase phase film. By controlling the number of cycles of $TiO_2$ and $Ta_2O_5$ deposition, the composition of the films was varied. No resistivity reading registered with the four point probe for the amorphous thin films formed prior to annealing. Resistivities for the three TiTaO compositions measured are illustrated in FIG. 4. The three $Ti_{1-x}Ta_xO_2$ thin films illustrated in FIG. 4 had x values between about 0.13 and about 0.30. The thin film with an x value about 0.22 had the lowest resistivity of the illustrated TiTaO thin films.

Example 3

An electrically conductive thin film can be used in a memory capacitor. First, a bottom electrode comprising ruthenium is deposited by an ALD type process using Ru cyclopentadienyl compounds. The ALD process comprises alternating and sequential pulses of a Ru precursor and an oxygen containing precursor. Next, a first conductive titanium oxide layer is formed by the processes described herein. Next an ultra-high-k layer is deposited directly over and contacting the conductive $TiO_2$ layer by an ALD process. The ultra-high-k layer is $SrTiO_3$ and is deposited by alternating and sequential pulses of a strontium cyclopentadienyl precursor, titanium alkoxide precursor and oxygen precursor. Optionally, a second conductive titanium oxide layer is then formed by the processes described herein. During the annealing step the amorphous titanium oxide layer crystallizes and becomes electrically conductive. The ultra-high k layer can also crystallize during the annealing step. Typically, the ultra-high k layer has a k-value of more than 50, and preferably more than 100 after the annealing step. The top electrode, comprising ruthenium, is then deposited directly over and contacting the optional second conductive titanium oxide layer or directly over and contacting the ultra-high-k layer in substantially the same way as the bottom electrode.

Example 4

Capacitor structures were also formed using TiNbO thin films deposited by the ALD processes described herein. A reference capacitor was first formed on glass to compare the electrical performance of the TiNbO capacitors. The reference capacitor was formed by first depositing an ITO layer on the glass, then depositing an $Al_2O_3$ layer (about 86 nm thick) directly over and contacting the ITO, and finally depositing an aluminum electrode directly over and contacting the $Al_2O_3$ layer.

A first test capacitor was formed on glass, by first depositing an ITO layer. Next, an 80 nm thick TiNbO layer was deposited directly over and contacting the ITO layer by the ALD processes described herein. The amorphous TiNbO layer was then annealed to form a crystalline structure. Next, an $Al_2O_3$ layer (about 86 nm thick) was deposited directly over and contacting the TiNbO layer. Finally, an aluminum electrode was formed directly over and contacting the $Al_2O_3$ layer. The electrical properties of the structure were suitable for use as a capacitor.

A second test capacitor was formed on silicon, by first growing a silicon dioxide layer approximately 150 nm thick. Next, a 100 nm thick TiNbO layer was deposited directly over and contacting the silicon dioxide layer by the ALD processes described herein. Next, an $Al_2O_3$ layer (about 86 nm thick) was deposited directly over and contacting the TiNbO layer. The TiNbO layer was annealed to form a crystalline structure after deposition of the aluminum oxide layer. Finally, an aluminum electrode was formed directly over and contacting the $Al_2O_3$ layer. The electrical properties of the TiNbO layer were suitable for use as a bottom electrode in a capacitor.

A third test capacitor was formed on silicon by first growing a silicon dioxide layer approximately 150 nm thick. Next, a 100 nm thick TiNbO layer was deposited directly over and contacting the silicon dioxide layer by the ALD processes described herein. The amorphous TiNbO layer was then annealed to form a crystalline structure. Next, an $Al_2O_3$ layer (about 86 nm thick) was deposited directly over and contacting the TiNbO layer. Finally, an aluminum electrode was formed directly over and contacting the $Al_2O_3$ layer. The electrical properties of the TiNbO layer were suitable for use as a bottom electrode in a capacitor.

Example 5

An electrically conductive $Ti_{1-x}Nb_xO_y$ or $Ti_{1-x}Ta_xO_y$ thin film can be formed by depositing $Ti_{1-x}Nb_xN_y$ or $Ti_{1-x}Ta_xN_y$ and subsequently converting all or part of the nitride layer to oxide by treatment with an oxygen source chemical.

A layer comprising $Ti_{1-x}Ta_xN_y$ or $Ti_{1-x}Nb_xN_y$ is first deposited by an ALD type process using titanium, nitrogen, and dopant precursors, such as $TiCl_4$, $NH_3$ and $TaCl_5$ or $NbCl_5$, respectively. The titanium deposition cycle comprises alternating and sequential pulses of a Ti precursor, such as $TiCl_4$, and ammonia. The dopant deposition cycle comprises alternating and sequential pulses of a Nb or Ta precursor, such as $TaCl_5$ or $NbCl_5$, and ammonia. The titanium deposition cycle and dopant deposition cycle are performed in a predetermined order based on the desired composition of the thin films.

Next, the $Ti_{1-x}Ta_xN_y$ or $Ti_{1-x}Nb_xN_y$ thin film is treated with an oxygen containing reactant to form electrically conductive thin films of $Ti_{1-x}Nb_xO_y$ or $Ti_{1-x}Ta_xO_y$. Suitable oxygen sources include, without limitation: water, ozone, oxygen, oxygen plasma, oxygen radicals, atomic oxygen, alcohol, and $H_2O_2$. An annealing step to enhance the crystallization of the oxide films may also be performed.

Example 6

An electrically conductive thin film can be used in a memory capacitor. First, a bottom electrode comprising $Ti_{1-x}Ta_xN_y$ or $Ti_{1-x}Nb_xN_y$ is deposited by an ALD type process using $TiCl_4$, $NH_3$ and $TaCl_5$ or $NbCl_5$, respectively. The titanium deposition cycle comprises alternating and sequential pulses of a Ti precursor, such as $TiCl_4$, and ammonia. The dopant deposition cycle comprises alternating and sequential pulses of a Nb or Ta precursor, such as $TaCl_5$ or $NbCl_5$, and ammonia. The titanium deposition cycle and dopant deposition cycle are performed in a predetermined order based on the desired composition of the thin films.

Next, an ultra-high-k layer comprising $SrTiO_3$ is deposited by an ALD process directly over and contacting the bottom electrode layer comprising $Ti_{1-x}Ta_xN_y$ or $Ti_{1-x}Nb_xN_y$. The $SrTiO_3$ ultra-high-k layer is deposited by alternating and sequential pulses of a strontium cyclopentadienyl precursor, titanium alkoxide precursor, and oxygen precursor.

During the first cycles of the ultra-high-k layer deposition, part of the $Ti_{1-x}Ta_xN_y$ or $Ti_{1-x}Nb_xN_y$ bottom electrode layer is oxidized and converted to a conductive $Ti_{1-x}Nb_xO_y$ or $Ti_{1-x}Ta_xO_y$ layer. That is, the oxygen precursor in the ultra-high-k layer deposition cycle can convert the surface of the bottom electrode from $Ti_{1-x}Ta_xN_y$ or $Ti_{1-x}Nb_xN_y$ to $Ti_{1-x}Nb_xO_y$ or $Ti_{1-x}Ta_xO_y$.

During an annealing step the oxidized surface of the $Ti_{1-x}Ta_xN_y$ or $Ti_{1-x}Nb_xN_y$ layer crystallizes more. The increased crystallization of the doped titanium nitride layer typically results in increased electrical conductivity.

The crystallinity of the ultra-high-k layer can also increase during the annealing step. Typically, the ultra-high k layer has a k-value of more than 50, and preferably more than 100 after the annealing step. A top electrode can be deposited on the ultra-high-k layer before or after an annealing step.

The methods disclosed herein provide many advantages over those known in the art. Embodiments of the methods disclose reliable and controllable methods for forming conductive titanium oxide thin films using an ALD process. The benefits of controllable and self limiting ALD processes are well known. The titanium oxide thin films are particularly well suited for use in memory capacitors. The conductive titanium oxide thin films also complement dielectric layers comprising titanium.

It will be appreciated by those skilled in the art that various modifications and changes can be made without departing from the scope of the invention. Similar other modifications and changes are intended to fall within the scope of the invention, as defined by the appended claims.

We claim:

1. A process for producing a doped titanium oxide layer on a substrate in a reaction chamber by atomic layer deposition, the process comprising:
   a titanium nitride deposition cycle comprising alternately and sequentially contacting the substrate with a titanium precursor and a first nitrogen precursor;
   a dopant nitride deposition cycle comprising alternately and sequentially contacting the substrate with a dopant precursor comprising a group V metal and a second nitrogen precursor,
   wherein the titanium nitride deposition cycle and dopant nitride deposition cycle are repeated until a doped titanium nitride thin film of a desired thickness and composition is obtained, and wherein the doped titanium nitride thin film comprises $Ti_{1-x}Nb_xN_y$ or $Ti_{1-x}Ta_xN_y$, wherein x is between 0 and 1 and y is between 1 and 2; and
   oxidizing at least a portion of the doped titanium nitride thin film to form the doped titanium oxide layer, wherein the doped titanium oxide layer is conductive and is doped with the group V metal.

2. The method of claim 1, wherein the doped titanium oxide thin film is deposited directly over and contacting a bottom electrode.

3. The method of claim 1, further comprising depositing a high-k structure directly over and contacting the doped titanium oxide thin film.

4. The method of claim 3, further comprising depositing a top electrode directly over and contacting the high-k structure.

5. The method of claim 3, wherein the high-k structure comprises an ultra-high-k material having a dielectric constant value above 10.

6. The method of claim 5, wherein the ultra-high-k material comprises Ti.

7. The method of claim 5, wherein the ultra-high-k material comprises one or more of $PbTiO_3$, $PbZr_xTi_{1-x}O_3$, $SrTiO_3$, $BaTiO_3$, $SrBaTiO_3$, $BiTaO_x$ and $SrBiTaO_x$.

8. The method of claim 1, wherein the first nitrogen precursor and the second nitrogen precursor are the same.

9. The method of claim 1, wherein the dopant precursor comprises tantalum or niobium.

10. The method of claim 1, further comprising annealing the $Ti_{1-x}Nb_xN_y$ or $Ti_{1-x}Ta_xN_y$ thin film at a temperature greater than 600° C.

11. The method of claim 1, wherein the doped titanium oxide layer has a resistivity less than 0.01 Ω·cm.

12. The method of claim 1, wherein the doped titanium oxide layer produced thereby has an optical transmittance of greater than 60% in the visible region.

13. The method of claim 1, wherein the dopant precursor comprises an organic ligand.

14. A process for producing a conductive doped titanium oxide layer on a substrate in a reaction chamber, the process comprising:
   a titanium nitride deposition cycle comprising:
      contacting the substrate with a vapor phase titanium precursor to form no more than a single molecular layer of the titanium precursor on the substrate;
      contacting the substrate with a first nitrogen precursor such that the first nitrogen precursor reacts with the titanium precursor on the substrate;
   a dopant nitride deposition cycle comprising:
      contacting the substrate with a vapor phase dopant reactant to form no more than a single monolayer of dopant reactant on the substrate surface, the vapor phase dopant reactant comprising a group V metal;
      contacting the substrate with a second nitrogen precursor such that the second nitrogen precursor reacts with the dopant reactant on the substrate surface;
   wherein the titanium nitride deposition and dopant nitride deposition cycles are repeated until a doped titanium nitride thin film is formed, and wherein the doped titanium nitride thin film comprises $Ti_{1-x}Nb_xN_y$ or $Ti_{1-x}Ta_xN_y$, wherein x is from 0 to 1 and y is from 1 to 2; and
   oxidizing at least a portion of the doped titanium nitride thin film to form the conductive doped titanium oxide layer.

15. The method of claim 14, wherein alternating titanium nitride layers and dopant nitride layers are formed.

16. The method of claim 14, wherein the titanium nitride deposition cycle is repeated from 1 to 10 times for each of the dopant nitride deposition cycles.

17. The method of claim 14, wherein the dopant nitride deposition cycle is repeated consecutively two or more times.

18. The method of claim 14, further comprising annealing the $Ti_{1-x}Nb_xN_y$ or $Ti_{1-x}Ta_xN_y$ thin film at a temperature greater than 600° C.

19. The method of claim 14, wherein at least one of the first and second nitrogen precursors comprises nitrogen-containing plasma.

20. The method of claim 19, wherein the nitrogen-containing plasma comprises a $N_2/H_2$-plasma or a $NH_3$-plasma.

21. The method of claim 14, wherein the titanium nitride deposition cycle and the dopant nitride deposition cycle are repeated at a ratio of 50:1 to 1:3.

\* \* \* \* \*

UNITED STATES PATENT AND TRADEMARK OFFICE
CERTIFICATE OF CORRECTION

| | | |
|---|---|---|
| PATENT NO. | : 9,646,820 B2 | Page 1 of 1 |
| APPLICATION NO. | : 14/570668 | |
| DATED | : May 9, 2017 | |
| INVENTOR(S) | : Viljami Pore et al. | |

It is certified that error appears in the above-identified patent and that said Letters Patent is hereby corrected as shown below:

In the Drawings

Sheet 1 of 10 (Reference Numeral 170, FIG. 1) at Line 2, Change "A N" to --AN--.

In the Specification

In Column 3 at Line 16, After "film" insert --.--.

In Column 13 at Line 21, Change "MoN," to --$MoN_x$,--.

In Column 13 at Line 21, Change "WN," to --$WN_x$,--.

In Column 14 at Line 23, Change "BiTaO" to --$BiTaO_x$--.

In Column 14 at Line 23, Change "SrBiTaO" to --$SrBiTaO_x$--.

In Column 14 at Line 37, Change "MoN," to --$MoN_x$,--.

In Column 14 at Line 37, Change "WN," to --$WN_x$,--.

In the Claims

In Column 20 at Line 35, In Claim 11, change "0.01 Ω·cm." to --0.01 Ω-cm.--.

Signed and Sealed this
Fifteenth Day of August, 2017

Joseph Matal
*Performing the Functions and Duties of the*
*Under Secretary of Commerce for Intellectual Property and*
*Director of the United States Patent and Trademark Office*